United States Patent
Fukuda et al.

(10) Patent No.: US 8,952,359 B2
(45) Date of Patent: Feb. 10, 2015

(54) ELECTRONIC DEVICE AND METHOD OF MANUFACTURING THE SAME, AND SEMICONDUCTOR DEVICE AND METHOD OF MANUFACTURING THE SAME

(75) Inventors: Toshio Fukuda, Kanagawa (JP); Noriyuki Kawashima, Kanagawa (JP)

(73) Assignee: Sony Corporation, Tokyo (JP)

( * ) Notice: Subject to any disclaimer, the term of this patent is extended or adjusted under 35 U.S.C. 154(b) by 761 days.

(21) Appl. No.: 13/212,605

(22) Filed: Aug. 18, 2011

(65) Prior Publication Data

US 2012/0049171 A1 Mar. 1, 2012

(30) Foreign Application Priority Data

Aug. 25, 2010 (JP) ................................. 2010-188103

(51) Int. Cl.
- *H01L 29/08* (2006.01)
- *H01L 35/24* (2006.01)
- *H01L 51/00* (2006.01)
- *H01L 51/05* (2006.01)
- *H01L 51/10* (2006.01)

(52) U.S. Cl.
CPC ........... *H01L 51/052* (2013.01); *H01L 51/0073* (2013.01); *H01L 51/105* (2013.01)
USPC .......................................... 257/40; 257/410

(58) Field of Classification Search
CPC . H01L 51/052; H01L 51/0073; H01L 51/105; H01L 51/502
USPC ........................ 257/40, 410, E21.409; 438/99
See application file for complete search history.

(56) References Cited

U.S. PATENT DOCUMENTS

| 5,399,604 | A | * | 3/1995 | Sano et al. | ..................... 524/356 |
| 2010/0328198 | A1 | * | 12/2010 | Tsubata | .......................... 345/87 |

FOREIGN PATENT DOCUMENTS

WO WO 03/016599 A1 2/2003

OTHER PUBLICATIONS

Veres, B. J. et al., Low-k Insulator As The Choice of Dielectrics in Organic Field-Effect Transistors, vol. 13, pp. 199 (2003).

*Primary Examiner* — Colleen A Matthews
*Assistant Examiner* — Quovaunda V Jefferson
(74) *Attorney, Agent, or Firm* — Dentons US LLP

(57) ABSTRACT

Disclosed herein is an electronic device, including: (A) a control electrode; (B) a first electrode and a second electrode; and (C) an active layer composed of an organic semiconductor material layer provided between the first electrode and the second electrode so as to face the control electrode through an insulating layer, wherein a portion of the insulating layer contacting at least the active layer is composed of a layer obtained by curing a material expressed by the general structural formula (1), (2) or (3):

(1)

-continued
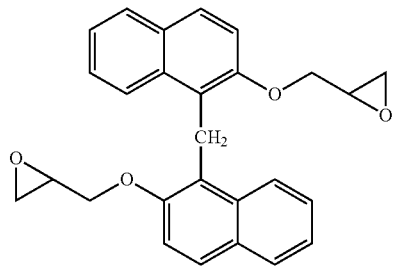
(2)
-continued
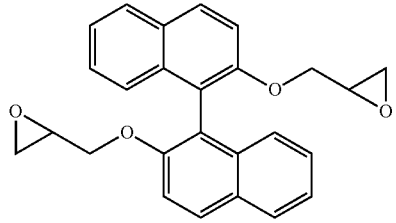
(3)
9 Claims, 6 Drawing Sheets

ELECTRONIC DEVICE AND METHOD OF MANUFACTURING THE SAME, AND SEMICONDUCTOR DEVICE AND METHOD OF MANUFACTURING THE SAME

BACKGROUND

The present disclosure relates to an electronic device and a method of manufacturing the same, and a semiconductor device and a method of manufacturing the same. More particularly, the disclosure relates to an electronic device having an active layer made of an organic semiconductor material and a method of manufacturing the same, and a semiconductor device having a channel formation region made of an organic semiconductor material and a method of manufacturing the same.

A Field Effect Transistor (FET) including a Thin Film Transistor (TFT) which is used in many electronic apparatuses at the present time, for example, is composed of a channel formation region, source/drain electrodes, a gate insulating layer, and a gate electrode. In this case, the channel formation region and the source/drain electrodes are formed either on a silicon semiconductor substrate or on a silicon semiconductor material layer. The gate insulating layer is made of $SiO_2$ and formed either on a silicon semiconductor substrate surface or on a silicon semiconductor material layer surface. Also, the gate electrode is formed so as to face the channel formation region through the gate insulating layer. It is noted that the FET having such a structure is referred to as "a top gate type FET" for the sake of convenience. Or, the FET is composed of a gate electrode formed on a substrate, a gate insulating layer made of $SiO_2$ and formed on the substrate including an upper portion of the gate electrode, and a channel formation region and source/drain electrodes formed on the gate insulating layer. It is noted that the FET having such a structure is referred to as "a bottom gate type FET" for the sake of convenience. Also, a very expensive semiconductor manufacturing system is used in manufacture of the FETs having these structures, respectively, and reduction in manufacturing cost is strongly desired.

From this situation, in recent years, the development of an electronic device using a thin film made of organic semiconductor molecules has been energetically carried out. In particular, organic electronics devices (hereinafter simply referred to as "organic devices" for short in some cases) such as an organic transistor, an organic light emitting device, and an organic solar cell attract attention. Low cost, light weight, flexibility, and high performance can be given as the ultimate goal of these organic devices. Also, it is said that the key of the development is the physicalities of the organic semiconductor materials. As compared with the silicon-centered inorganic materials, the organic semiconductor materials have various kinds of advantages:

(1) an organic device having a large area can be manufactured at a low cost, at a low temperature, and with a simple process;

(2) an organic device having flexibility can be manufactured; and (3) molecules composing an inorganic material are modified into a desired form, thereby making it possible to control the performance and physicality of the organic device.

Also, in particular, a study about an application deposition method such as a printing method is progressed as a low-temperature and simple process. This technique, for example, is described in WO2003/016599.

Now, for manufacturing the organic device at the low temperature and with the simple process, it is important to form various kinds of layers as well other than the channel formation region in a low temperature process. For this reason, for example, a study for making the gate insulating layer of an organic material, specifically, a coating material obtained by dissolving polymer molecules is being progressed.

SUMMARY

When the organic device is provided on the resin substrate having the flexibility, preferably, the constituent elements such as the gate insulating layer and the organic semiconductor material layer which are to be provided on the substrate is formed as at a low temperature as possible, specifically, at a process temperature of 200° C. or less, more preferably, 180° C. or less. The reason why the process temperature is lowered is because when the resin substrate is exposed to a high temperature ambient atmosphere, there is the possibility that the resin substrate is contracted or softened to be deteriorated, so that the organic device itself is destroyed. For this reason, various kinds of approaches are carried out in order to form the gate insulating layer at the low temperature of 200° C. or less.

A document of Tatsuya Shimada et al., "Organic Transistor by Inkjet Printing Method", Applied Physics, Vol. 70, p. 1452 (2001) discloses a technique in which polyvinylphenol (PVP) is used in the gate insulating layer, and both of an electrode and an organic semiconductor material layer are formed by utilizing an inkjet printing method. In addition, a document of Veres B. J., et al., "Low-k insulator as the choice of dielectrics in organic field-effect transistors", Vol. 13, pp. 199 (2003) discloses a technique for manufacturing an FET in which polytriallylamine is provided on a gate insulating layer having a low relative permittivity. However, in any of these techniques, a thermoplastic resin is used in the material composing the gate insulating layer. Therefore, an excellent workability is obtained, whereas a problem is left in a solvent resistance and a thermal stability. Thus, it is difficult to form a delicate layer formed from a thin film and showing an insulating property. In addition, an example is reported in which polyimide which is known to be high in insulating property is used in an insulating layer. However, when polyimide is tried to be polymerized from a precursor to form the insulating layer, it is necessary to set a high temperature of 250° C. or more.

The present disclosure has been made in order to solve the problems described above, and it is therefore desirable to provide a method of manufacturing an electronic device including an insulating layer which can be formed at a low temperature as compared with the case of the related art, and a method of manufacturing a semiconductor device including a gate insulating layer which can be formed at a low temperature as compared with the case of the related art, and the electronic device obtained by utilizing the method of manufacturing the same, and the semiconductor device obtained by utilizing the method of manufacturing the same.

In order to attain the desire described above, according to an embodiment of the present disclosure, there is provided an electronic device including: (A) a control electrode; (B) a first electrode and a second electrode; and (C) an active layer composed of an organic semiconductor material layer provided between the first electrode and the second electrode so as to face the control electrode through an insulating layer, in which a portion of the insulating layer contacting at least the active layer is composed of a layer obtained by curing a material expressed by the general structural formula (1), (2) or (3):

(1)
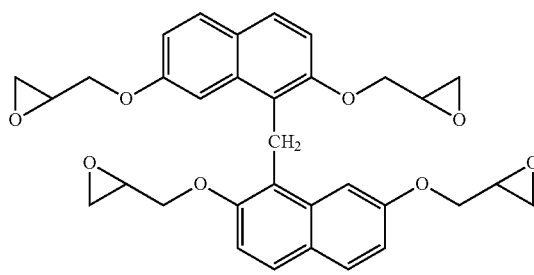

(2)
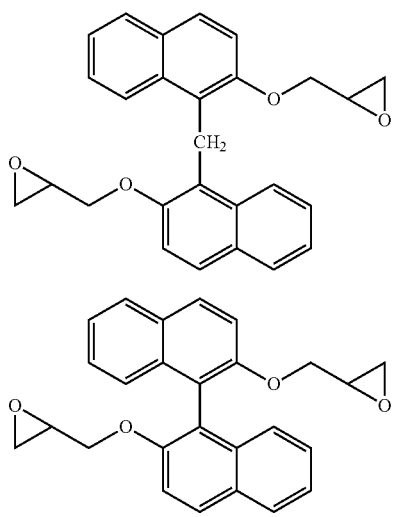

(3)
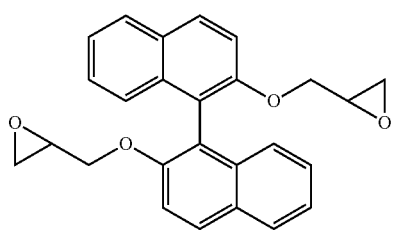

According to another embodiment of the present disclosure, there is provided a method of manufacturing an electronic device including: (A) a control electrode; (B) a first electrode and a second electrode; and (C) an active layer provided between the first electrode and the second electrode so as to face the control electrode through an insulating layer, in which a portion of the insulating layer contacting at least the active layer is formed by curing a material expressed by the general structural formula (1), (2) or (3):

(1)
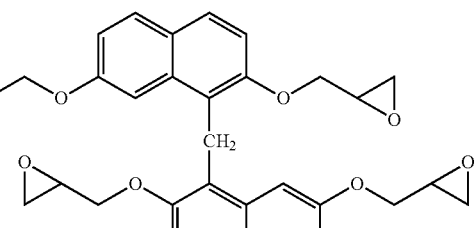

(2)
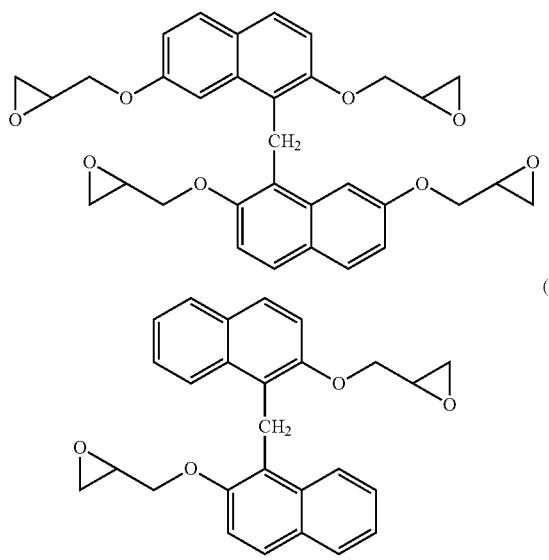

(3)
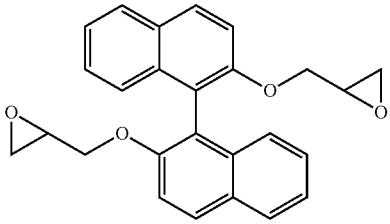

According to still another embodiment of the present disclosure, there is provided a semiconductor device including a gate electrode, a gate insulating layer, source/drain electrodes, and a channel formation region on a substrate, in which a portion of the gate insulating layer contacting at least the channel formation region is composed of a layer obtained by curing a material expressed by the general structural formula (1), (2) or (3):

(1)
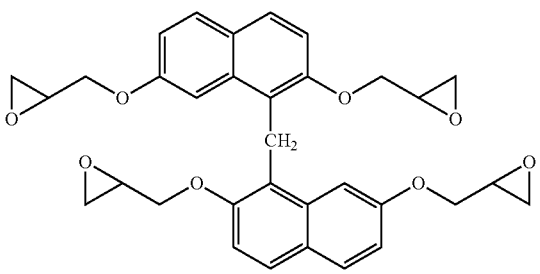

(2)
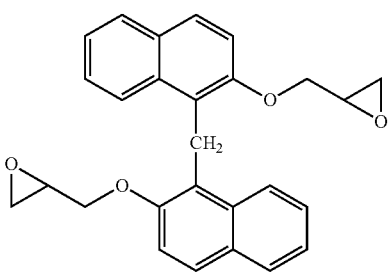

(3)
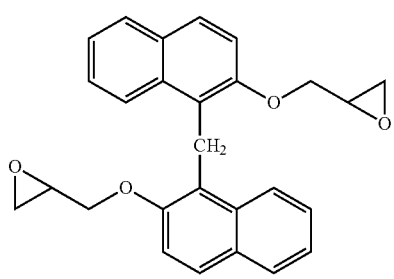

According to yet another embodiment of the present disclosure, there is provided a method of manufacturing a semiconductor device, more specifically, a bottom gate•bottom contact type semiconductor device, including: (a) forming a gate electrode on a substrate and forming a gate insulating layer over an entire surface; (b) forming source/drain electrodes on the gate insulating layer; (c) and forming a channel formation region composed of an organic semiconductor material layer on the gate insulating layer located at least between the source/drain electrodes, in which a portion of the gate insulating layer contacting at least the channel formation region is formed by curing a material expressed by the general structural formula (1), (2) or (3):

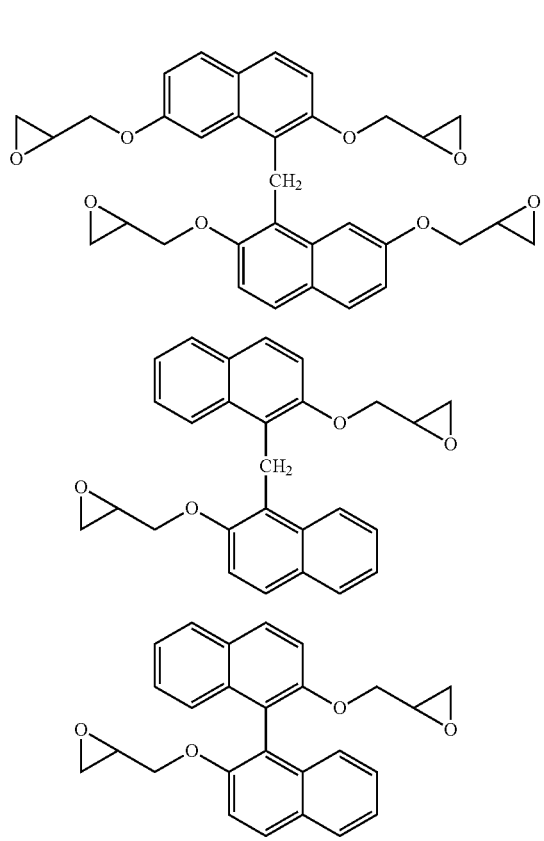

(1)
(2)
(3)

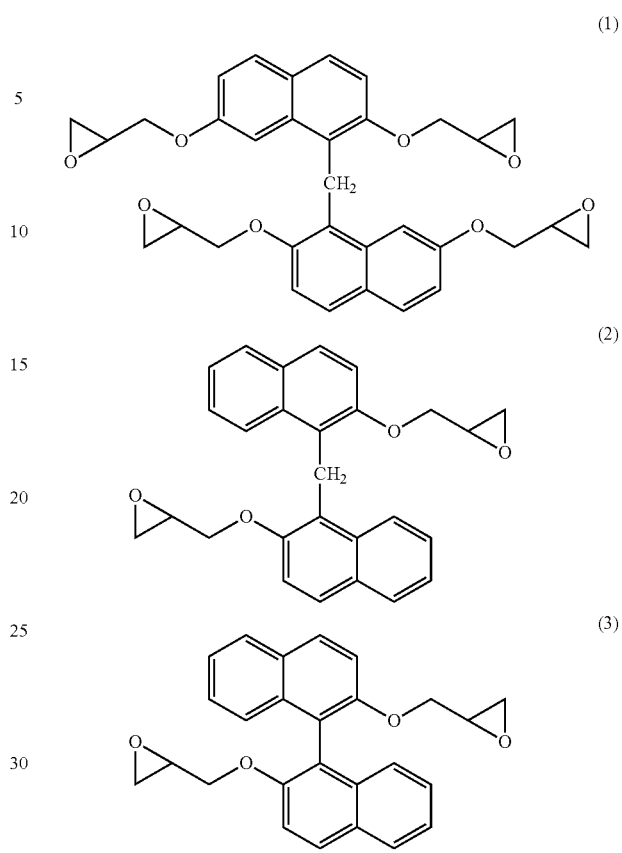

(1)
(2)
(3)

Note that, the bottom gate•bottom contact type semiconductor device thus obtained (specifically, the bottom gate•bottom contact type field effect transistor, FET, and more specifically, the bottom gate•bottom contact type thin film transistor, TFT) includes:

(A) a gate electrode formed on a substrate;

(B) a gate insulating layer formed on the gate electrode and the substrate;

(C) source/drain electrodes formed on the gate insulating layer; and (D) a channel formation region composed of an organic semiconductor material layer and formed on the gate insulating layer between the source/drain electrodes, in which a portion of the gate insulating layer contacting at least the channel formation region is composed of the layer obtained by curing the material expressed by the general structural formula (1), (2) or (3).

According to a further embodiment of the present disclosure, there is provided a method of manufacturing a semiconductor device, more specifically, a bottom gate•top contact type semiconductor device, including: (a) forming a gate electrode on a substrate and forming a gate insulating layer over an entire surface; (b) forming a channel formation region and a channel formation region extending portion each composed of an organic semiconductor material layer on the gate insulating layer; and (c) forming source/drain electrodes on the channel formation region extending portion, in which a portion of the gate insulating layer contacting at least the channel formation region is formed by curing a material expressed by the general structural formula (1), (2) or (3):

Note that, the bottom gate•top contact type semiconductor device thus obtained (specifically, the bottom gate•top contact type field effect transistor, FET, and more specifically, the bottom gate•bottom contact type thin film transistor, TFT) includes:

(A) a gate electrode formed on a substrate;

(B) a gate insulating layer formed on the gate electrode and the substrate;

(C) a channel formation region and a channel formation region extending portion each composed of an organic semiconductor material layer and formed on the gate insulating layer; and (D) source/drain electrodes formed on the channel formation region extending portion, in which a portion of the gate insulating layer contacting at least the channel formation region is composed of the layer obtained by curing the material expressed by the general structural formula (1), (2) or (3).

According to a still further embodiment of the present disclosure, there is provided a method of manufacturing a semiconductor device including: (a) forming source/drain electrodes on a substrate; (b) forming a channel formation region composed of an organic semiconductor layer over an entire surface; and (c) forming a gate insulating layer over an entire surface, and forming a gate electrode on a portion of the gate insulating layer on the channel formation region, in which a portion of the gate insulating layer contacting at least the channel formation region is formed by curing a material expressed by the general structural formula (1), (2) or (3):

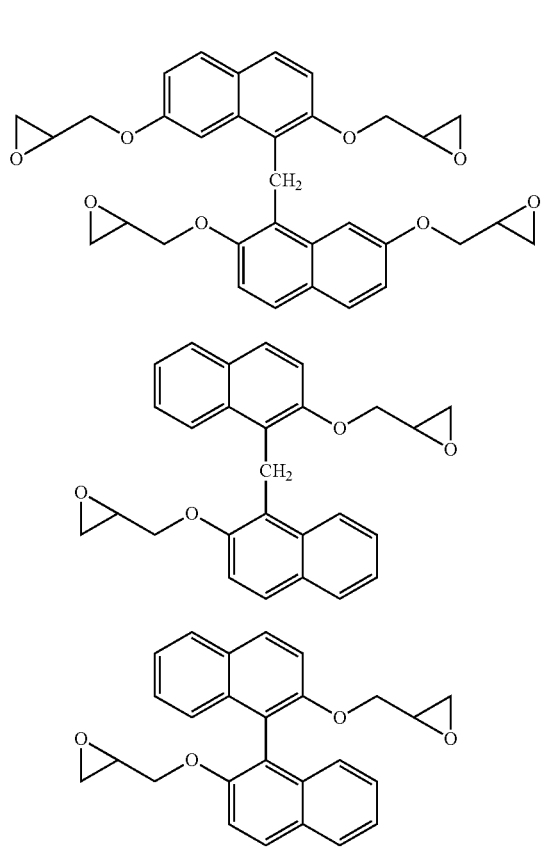

(1)
(2)
(3)

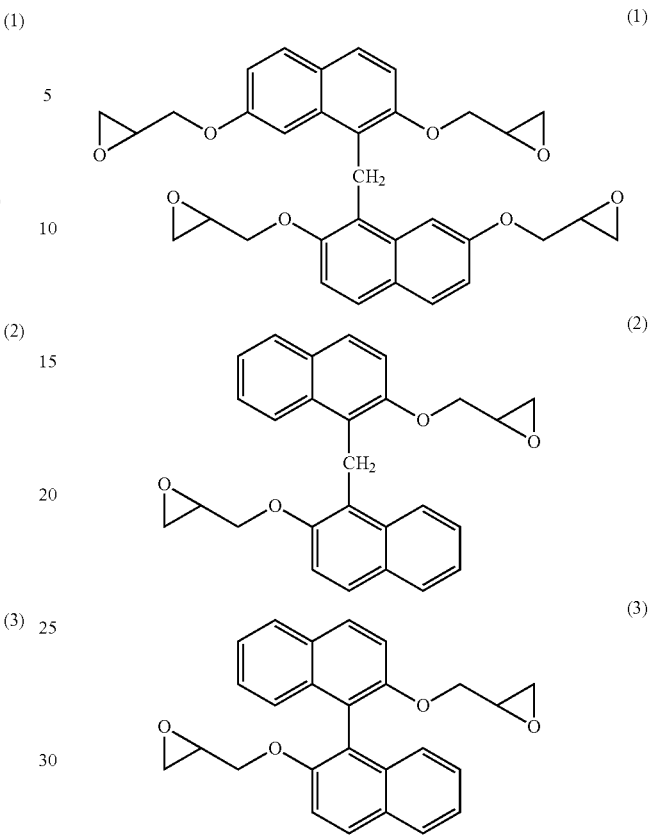

(1)
(2)
(3)

Note that, the bottom gate•top contact type semiconductor device thus obtained (specifically, the bottom gate•top contact type field effect transistor, FET, and more specifically, the bottom gate•top contact type thin film transistor, TFT) includes:

(A) source/drain electrodes formed on a substrate;

(B) a channel formation region composed of an organic semiconductor material layer and formed on the substrate between the source/drain electrodes;

(C) a gate insulating layer formed on the channel formation region; and (D) a gate electrode formed on the gate insulating layer, in which a portion of the gate insulating layer contacting at least the channel formation region is composed of the layer obtained by curing the material expressed by the general structural formula (1), (2) or (3).

According to a yet further embodiment of the present disclosure, there is provided a method of manufacturing a semiconductor device, including: (a) forming a channel formation region and a channel formation region extending portion each composed of an organic semiconductor material layer on a substrate; (b) forming source/drain electrodes on the channel formation region extending portion; and (c) forming a gate insulating layer over an entire surface, and forming a gate electrode on a portion of the gate insulating layer on the channel formation region, in which a portion of the gate insulating layer contacting at least the channel formation region is formed by curing a material expressed by the general structural formula (1), (2) or (3):

Note that, the top gate•bottom contact type semiconductor device thus obtained (specifically, the top gate•bottom contact type field effect transistor, FET, and more specifically, the top gate•bottom contact type thin film transistor, TFT) includes:

(A) a channel formation region and a channel formation region extending portion each composed of an organic semiconductor material layer and formed on a substrate;

(B) source/drain electrodes formed on the channel formation region extending portion;

(C) a gate insulating layer formed on the source/drain electrodes and the channel formation region; and (D) a gate electrode formed on the gate insulating layer, in which a portion of the gate insulating layer contacting at least the channel formation region is composed of the layer obtained by curing the material expressed by the general structural formula (1), (2) or (3).

As set forth hereinabove, according to the present disclosure, the portion of the insulating layer contacting at least the active later or the portion of the gate insulating layer contacting at least the channel formation region is formed by curing the material expressed by the general structural formula (1), (2) or (3) described above. In this case, the temperature (curing temperature) necessary for the curing is equal to or lower than 180° C., and thus the formation of that portion at the lower temperature than that in the related art is possible. Therefore, it is possible to provide the electronic device or the semiconductor device as the organic device on the resin substrate having the flexibility. Also, it is possible to provide the inexpensive electronic device or semiconductor device having the high reliability with the high mass production.

DETAILED DESCRIPTION OF THE PREFERRED EMBODIMENTS

Figure 1A:
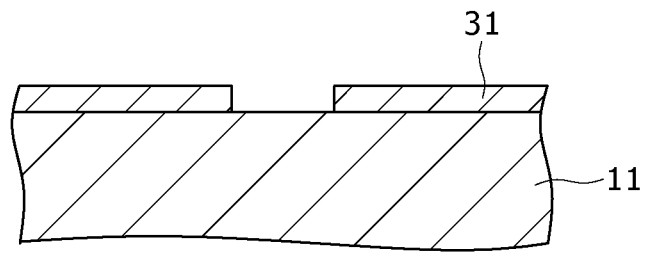
FIGS. 1A to 1I are respectively schematically partial cross sectional views of a substrate and the like explaining a method of manufacturing a semiconductor device of Example 1.

Although hereinafter, the present disclosure will be described in detail based on Examples, the present disclosure is by no means limited to Examples, and various numerical values and materials in Examples are merely exemplified. It is noted that the description will be given in accordance with the following order:

1. Description with Respect to the Whole of Electronic Device of the Present Disclosure and Method of Manufacturing the Same, and Semiconductor Device and Method of Manufacturing the Same according to First to Fourth embodiments;

2. Example 1 (Electronic Device of the Present Disclosure and Method of Manufacturing the Same, and Semiconductor Device of the Present Disclosure and Method of Manufacturing the Same According to First Embodiment of the Present Disclosure);

3. Example 2 (Change of Example 1, Method of Manufacturing Semiconductor Device According to Second Embodiment of the Present Disclosure);

4. Example 3 (Another Change of Example 1, Method of Manufacturing Semiconductor Device According to Third Embodiment of the Present Disclosure); and 5. Example 4 (Still Another Change of Example 1, Method of Manufacturing Semiconductor Device According to Fourth Embodiment of the Present Disclosure), and others.

1. Description with Respect to the Whole of Electronic Device of the Present Disclosure and Method of Manufacturing the Same, and Semiconductor Device and Method of Manufacturing the Same According to First to Fourth Embodiments In an electronic device of the present disclosure, or an electronic device obtained by utilizing a method of manufacturing the same of the present disclosure, a current caused to flow through an active layer from a first electrode toward a second electrode is controlled by a voltage applied to a control electrode. Specifically, the electronic device can be composed of a field effect transistor in which the control electrode corresponds to a gate electrode, the first electrode and the second electrode correspond to source/drain electrodes, respectively, an insulating layer corresponds to a gate insulating layer, and the active layer corresponds to a channel formation region. Or, the electronic device can be composed of a light emitting device (such as an organic light emitting device or an organic light emitting transistor) in which an active layer emits a light by application of voltages to a control electrode, and a first electrode and a second electrode. Here, in the light emitting device, an organic semiconductor material composing the active layer has a light emitting function based on accumulation of electric charges due to modulation based on the voltage applied to the control electrode, and a recombination of electrons and holes injected. Either an organic semiconductor material having a p-type conductivity or a non-doped organic semiconductor material can be generally used as the organic semiconductor material composing the active layer. In the light emitting element (organic light emitting transistor) having the active layer composed of the organic semiconductor material having the p-type conductivity, an emission intensity is proportional to an absolute value of a drain current, and can be modulated by a gate voltage and a voltage developed across the source/drain electrodes. It is noted that whether the electronic device fulfills a function as the field effect transistor or fulfills a transistor as the light emitting device depends on a state of application of the voltages (biases) to the first electrode and the second electrode. Firstly, the modulation is carried out for the control electrode after the bias falling within the range in which the electron injection from the second electrode is not caused, which results in that the current is caused to flow from the first electrode to the second electrode. This is the transistor operation. On the other hand, when the biases to the first electrode and the second electrode are increased after the holes are sufficiently accumulated, the electron injection is started, and the light emission is caused by the recombination of the electrons and the holes. Or, the electronic device can be composed of a photoelectric conversion device in which a current is caused to flow between the first electrode and the second electrode by radiation of a light to the active layer. When the photoelectric conversion device is structured from the electronic device, specifically, a solar cell or an image sensor can be composed of the photoelectric conversion device. In this case, the application of the voltage to the control electrode may not be carried out, or may be carried out. In the case of the latter, the current being caused to flow can be modulated by application of the voltage to the control electrode. It is noted that when the electronic device is composed of either the light emitting device or the photoelectric conversion device, the constitution and structure of either the light emitting device or the photoelectric conversion device, for example, can be made identical to any one of the constitution and structure of the four kinds of field effect transistors described above.

In the electronic device including the above preferable constitution of the present disclosure or a method of manufacturing the same, and the semiconductor device of the present disclosure or the methods of manufacturing the same according to the first to fourth embodiments of the present disclosure, it is possible to adopt a form in which after application of a liquid solution containing therein the material expressed by the general structural formula (1), (2) or (3), and a curing agent, the liquid solution is then heated, thereby forming a portion of the gate insulating layer contacting at least the channel formation region (or a portion of the insulating layer contacting at least the active layer). In addition, in the electronic device including the above preferable constitution and form of the present disclosure or a method of manufacturing the same, and the semiconductor device of the present disclosure or the method of manufacturing the same according to the first to fourth embodiments of the present disclosure, it is possible to adopt a form in which after application of a liquid solution containing therein the organic semiconductor material, the liquid solution is then dried, thereby forming the organic semiconductor material layer.

In the electronic device including the above preferable constitution and form of the present disclosure or the method of manufacturing the same, and the semiconductor device of the present disclosure or the method of manufacturing the same according to the first to fourth embodiments of the present disclosure (hereinafter collectively referred simply to as "the present disclosure" in some cases), either the portion of the insulating layer containing at least the active layer, or the portion of the gate insulating layer contacting at least the channel formation region is composed of the layer obtained by curing the material expressed by the general structural formula (1), (2) or (3). In this case, either the insulating layer or the gate insulating layer (hereinafter, they are collectively referred to as "the gate insulating layer or the like" in some cases) may be a single layer or may be a multilayer. In the case of the latter, it is only necessary to compose the layer, such as the gate insulating layer having the multilayer structure, closest to either the active layer or the channel formation region (the layer adjacent to either the active layer or the channel formation region) of the layer obtained by curing the material expressed by the general structural formula (1), (2) or (3). Also, it is only necessary to suitably determine the insulating materials composing other layers other than the layer adjacent to either the active layer or the channel formation region in the gate insulating layer and the like. For example, not only an inorganic insulating material, but also an organic insulating material can be given as such insulating materials, or a combination of the inorganic insulating material and the organic insulating material can also be used as such insulating materials. In this case, the inorganic insulating material is exemplified by a metallic oxide high permittivity insulating film such as a silicon oxide-based material, a silicon nitride ($SiN_y$), an aluminum oxide ($Al_2O_3$) or $HfO_2$. Also, the organic insulating material is exemplified by an organic insulating material (organic polymer) exemplified by polymethylmethacrylate (PMMA), polyvinylphenol (PVP), polyvinylalcohol (PVA), polycarbonate (PC), polyethylene terephthalate (PET), polystyrene, a silanol derivative (silane coupling agent) such as N-2(aminoethyl)3-aminopropyltrimethoxysilane (AEAPTMS), 3-mercaptopropyltrimethoxysilane (MPTMS) or octadecyltrichlorosilane (OTS), or a linear hydrocarbon class, having a functional group capable of being coupled to either a control electrode or a gate electrode at one end thereof, such as octadecanethiol or dodecylisocyanate. Here, a silicon oxide ($SiO_x$), BPSG, PSG, BSG, AsSG, PbSG, a silicon oxynitride (SiON), a spin-on glass (SOG), or a low permittivity $SiO_2$-based material (such as polyarylether, cycloperfluorocarbonpolymer, benzocyclobutene, a cyclic fluorine resin, polytetrafluoroethylene, arylether fluoride, polyimide fluoride, amorphous carbon or organic SOG) can be exemplified as the silicon oxide-based material.

The gate insulating layer or the like in the present disclosure is composed of an epoxy resin composition (epoxy resin cured material) obtained by curing an epoxy resin (prepolymer) by a curing agent. In this case, the epoxy resin (prepolymer) is composed of a monomer having a glycidyl, and a copolymer composed of a monomer which can be copolymerized and is selected from alkylstyrene. For example, that epoxy resin is a naphthalene framework type 4 functional epoxy resin.

In addition to the application method, a combination of any one of a liftoff method, a sol-gel method, an electro-deposition method, and a shadow mask method, and a patterning technique as may be necessary can be given as a formation method for the gate insulating layer or the like. Here, various kinds of printing methods such as a screen printing method, an inkjet printing method, an offset printing method, an inversion offset printing method, a gravure printing method, and a micro contact method; various kinds of coating methods such as a spin coating method, an Air Doctor coater method, a blade coater method, a rod coater method, a knife coater method, a squeeze coater method, a reverse roll coater method, a transfer roll coater method, a gravure coater method, a kiss coater method, a caste coater method, a spray coater method, a slit orifice coater method, a calendar coater method, a casting coater method, a capillary coater method, and a dipping method; and a method of applying a liquid material such as a spray method, a method using a dispenser, and a stamp method can be given as the application methods.

A solvent of an aromatic series class such as toluene, xylene, mesitylene, or tetralin, a ketone class such as cyclopentanone or cyclohexanone, or a hydrocarbon class such as, PGMEA or decalin can be exemplified as a solvent used in solution preparation for the application. Two or more kinds of them may be suitably selected to be used as a mixed solvent.

When the gate insulating layer or the like is formed, the material expressed by the general structural formula (1), (2) or (3) either may be singularly used or may be mixed with any other suitable resin (for example, a resin, such as any other epoxy series resin or an acrylic resin, which is not separated in the phase of the solvent preparation) to be used.

Thermoset catalysts (thermoset curing agents) (11) to (25), and energy line curing type catalysts (energy line curing type curing agents) (31) to (38) can be preferably exemplified as the curing agent. Or, of them, one kind of curing agent can be singularly used, or two or more kinds of mixed curing agents can also be used.

[Thermoset Catalysts]

(11) Chain aliphatic primary diamine such as polymethylene diamine, dipropylene diamine or trimethylhexamethylene diamine.

(12) Chain aliphatic primary polyamine such as iminobispropylamine, 1,3,6-trisaminomethylhexane, or tetraethylenepentamine.

(13) Alicyclic polyamine such as N-aminoethylpiperazine or bis(4-amino-3-methylcyclohexacyl)methane.

(14) Aromatic contained aliphatic primary amine such as meta-xylene diamine.

(15) Aromatic primary amine such as metaphenylenediamine, 2,4-diaminodiphenylamine, or diaminodiphenylsulfone.

(16) Secondary amine such as dimethylamine or diethylamine.

(17) Ternary amine such as dimethylcyclohexylamine, pyridine, or α-picoline.

(18) Aromatic series acid anhydride such as phthalic anhydride, pyromellitic anhydride, or glyceroltris (anhydrotrimellitate).

(19) Cyclic aliphatic acid anhydride such as maleic acid anhydride, methyltetrahydrophthalic acid anhydride, or methylcyclohexene tetra carboxylic acid anhydride.

(20) Aliphatic acid anhydride such as polyadipic acid anhydride, polyazelaic acid anhydride, or polysebacic acid anhydride.

(21) A polyamide resin obtained from a condensation reaction between a dimer acid and polyamine.

(22) An imidazole class such as 2-methylimidazole, 1-cyanoethyl-2-ethyl-4-methylimidazole, or 1-cyanoethyl-2-phenylimidazolium.trimellitate.

(23) A latency curing agent such as a borontrifluoride-amine complex, organic acid hydrazide, or a salt of polyamine.

(24) Polymercaptan such as liquid polymercaptan or polysulfide.

(25) A synthetic resin nascent condensate such as a novolac type phenol resin or polyvinylphenol.

[Energy Line Curing Type Curing Agents]

(31) An aryldiazonium salt such as phenyldiazoniumtetrafluoro borate or 4-methoxyphenyldiazoniumhexafluoro phosphate.

(32) A diaryliodonium salt such as diphenyliodoniumtetrafluoro borate, or di(4-butylphenyl)iodoniumhexafluoro phosphate.

(33) A triarylsulfonium salt such as triphenylsulfoniumhexafluorophosphate, triphenylsulfoniumtetrafluoro borate, or tris(4-methoxyphenyl)sulfoniumhexafluorophosphate.

(34) A dialkylphenacylsulfonium salt such as dimethylphenacylsulfoniumhexafluorophosphate, or phenacyltetramethylenesulfoniumtetrafluoro borate.

(35) A dialkyl-4-hydroxyphenylsulfonium salt such as 3,5-dimethyl-4-hydroxyphenylsulfoniumtetrafluoro borate or 3,5-dibutyl-4-hydroxyphenylsulfonium-hexafluoroantimonate.

(36) A sulfonic acid ester such as α-hydroxymethylbenzoinsulfonic acid ester, N-hydroxyimidesulfonate, or α-sulfonyloxyketone.

(37) A triazine compound such as 2-(4-methoxyphenyl)-4,6-di(trichloromethyl)triazine.

(38) A diazonaphthoquinone compound such as an orthodiazonaphthoquinone-4-sulfonic acid ester, or an orthodiazonaphthoquinone-5-sulfonic acid ester.

It is only necessary to set a used amount of curing agent to an equivalent amount of epoxy group of the copolymer. Thus, 0.01 to 50 pts. wt. of curing agent, preferably, 0.1 to 20 pts. wt. of curing agent can be exemplified per 100 pts. wt. of epoxy resin (prepolymer). In particular, all it takes is that 0.01 to 5 pts. wt. of curing agent is set per 100 pts. wt. of epoxy resin (prepolymer) when any of the thermoset catalysts described in (11) to (25) is used, and 1 to 50 pts. wt. of curing agent is set per 100 pts. wt. of epoxy resin (prepolymer) when any of the energy line curing type curing catalysts described in (31) to (38) is used.

The epoxy resin compound (epoxy resin cured material) in the present disclosure is composed of two components: (1) the copolymer; and (2) the curing agent. In addition thereto, an additive agent such as a curing accelerator, a mold release agent, a flexibilizing agent, a coupling agent, or a filler may be suitably added without impairing any of the effects of the present disclosure.

In the present disclosure, polythiophene, poly-3-hexylthiophene [P3HT] obtained by introducing a hexyl group into polythiophene, pentacene[2,3,6,7-dibenzo anthracene], a dioxaanthanthrene-based compound containing therein perixanthenoxanthene or the like, polyanthracene, naphthacene, hexacene, heptacene, dibenzopentacene, tetrabenzopentacene, chrysene, perylene, coronene, terylene, ovalene, quoterylene, circumanthracene, benzopyrene, dibenzopyrene, triphenylene, polypyrrole, polyamine, polyacethylene, polydiacethylene, polyphenylene, polyfuran, polyindole, polyvinylcarbazole, polyselenophene, polytellurophene, polyisothianaphthene, polycarbazole, polyphenylenesulfide, polyphenylenvinylene, polyphenylenesulfide, polyvinylenesulfide, polythienylenevinylene, polynaphthalene, polypyrene, polyazulene, phthalocyanine typified by copper phthalocyanine, merocyanine, hemicyanine, polyethylenedioxythiophene, pyridazine, naphthalenetetracarboxylic diimide, poly(3,4-ethylenedioxythiophene)/polystyrenesulfonic acid [PEDOT/PSS], or quinacridone can be exemplified as the organic semiconductor material. Or, a compound selected from the group consisting of a condensed polycyclic aromatic compound, a porphyrin-based derivation, a phenylvinylidene-based conjugate system oligomer, and a thiophene-based conjugate system oligomer can be given as the organic semiconductor material in the present disclosure. Specifically, for example, the condensed polycyclic aromatic compound such as an acene-based molecule (such as pentacene or tetracene), a porphyrin-based molecule, and a conjugate-based oligomer (such as phenylvinyliden system or a thiophene system) can be given as the organic semiconductor compound in the present disclosure.

Or, for example, porphyrin, 4,4'-biphenyldithiol (BPDT), 4,4'-diisocyanobiphenyl, 4,4'-diisocyano-p-terphenyl, 2,5-bis(5'-thioacetyl-2'-thiophenyl)thiophene, 2,5-bis(5'-thioacetoxyl-2'-thiophenyl)thiophene, 4,4'-diisocyanophenyl, benzidine(biphenyl-4,4'-diamine), TCNQ (tetracyanoquinodimethane), a charge-transfer complex typified by a tetrathiafulvalene (TTF)-TCQN complex, a bisethylenetetrathiafulvalene (BEDTTTF)-perchloric acid complex, a BEDTTF-iodine complex, or a TCNQ-iodine complex, a biphenyl-4,4'-dicarboxylic acid, 1,4-di(4-thiophenylacetylinyl)-2-ethylbenzene, 1,4-di(4-isocyanophenylacetylinyl)-2-ethylbenzene, dendrimer, flullerene such as C60, C70, C76, C78, or C84, 1,4-di(4-thiophenylethyl)-2-ethylbenzene, 2,2''-dihydroxy-1,1':4',1''-terphenyl, 4,4'-biphenyldiolethanal, 4,4'-biphenyldiol, 4,4'-biphenyldiisocyanate, 1,4-diasetynylbenzene, diethylbiphenyl-4,4'-dicarboxylate, benzo[1,2-c; 3,4-c'; 5,6,c'']tris[1,2]dithiol-1,4,7-trithione, alpha-sexithiophene, tetrathiotetracene, tetraselenotetracene, tetratelluriumtetracene, poly(3-alkylthiophene), poly(3-chiophene-β-ethanesulfonic acid), poly(N-alkylpyrrol), poly(3-alkylpyrrol), poly(3,4-dialkylpyrrol), poly(2,2'-thienylpyrrol), or poly(dibenzothiophenesulfide) can be exemplified as the organic semiconductor material in the present disclosure.

An aromatic class such as toluene, xylene, mesitylene, or tetralin, a ketone class such as cyclopentanone or cyclohexanone, a hydrocarbon class such as decalin, or the like can be exemplified as a solvent for preparing an organic semiconductor material liquid solution. In particular, it is preferable to use a solvent having a relatively high boiling point such as mesitylene, tetralin or decalin from viewpoints of the transistor characteristics, and of preventing the organic semiconductor layer from being abruptly dried in a phase of the deposition of the organic semiconductor layer.

In addition to the organic semiconductor material, the polymer may be contained in the active layer or the channel formation region (organic semiconductor material layer) as may be necessary. It is only necessary to dissolve the polymer into an organic solvent. Specifically, polystyrene, polyalphamethylstyrene, or polyolefin can be exemplified as the polymer (organic bonding agent). In addition, as the case may be, an additive agent (a so-called doping material such as an n-type impurity or a p-type impurity) can be added.

The application method can be given as a method of forming the active layer, the channel formation region, or the channel formation region and the channel formation region extending portion in the method of manufacturing the electronic device of the present disclosure including the preferred constitutions as has been described so far, or in the methods of manufacturing the semiconductor device according to the first to fourth embodiments of the present disclosure including the preferred constitutions as has been described so far. Here, any of the general application methods can be used as the application method without causing any of problems. Specifically, for example, the various kinds of application methods described above can be given as the application method.

The substrate can be made of any of a silicon oxide-based material (such as $SiO_x$ or a Spin-On Glass (SOG); a silicon nitride ($SiN_y$); an aluminum oxide ($Al_2O_3$); and a metallic oxide high permittivity insulating film. When the substrate is made of any of these materials, it is only necessary to form the substrate on a supporting body (or above the supporting body) which is suitably selected from the materials which will be given below. That is to say, a plastic film, a plastic sheet, and a plastic substrate each having the flexibility and composed of an organic polymer exemplified by polymethylmethacrylate (methyl polymethacrylate: PMMA), polyvinyl alcohol (PVA), polyvinylphenol (PVP), polyethersulfone (PES), polyimide, polycarbonate (PC), polyethylene terephthalate (PET), or polyethylene naphthalate (PEN) can be given as a substrate other than the substrate described above. Or, mica can be given as a material for the substrate other than those materials for the substrate described above. When the substrate made of such an organic polymer or polymer material having the flexibility, for example, incorporation or integration of the electronic device or the semiconductor device into or with the display device or the electronic apparatus having a cured surface shape becomes possible. Or, various kinds of glass substrates, various kinds of glass substrates each having an insulating film formed on a surface thereof, a quartz substrate, a quartz substrate having an insulating film formed on a surface thereof, a silicon substrate having an insulating film formed on a surface thereof, a sapphire substrate, or a metallic substrate made of any of various kinds of alloys such as stainless, or any of various kinds of metals can be given as the substrate. With regard to the supporting body having the electric insulation property, it is only necessary to select a suitable material from the materials which have been described so far. In addition thereto, a conductive substrate (such as a substrate made of a metal such as gold or aluminum, a substrate made of high-orientation graphite, or a stainless substrate) can be given as the supporting body. In addition, although the semiconductor device is provided on the supporting body depending on the constitution and structure of the semiconductor device, that supporting body can also be made of any of the materials described above.

A metal such as platinum (Pt), gold (Au), palladium (Pd), chromium (Cr), molybdenum (Mo), nickel (Ni), aluminum (Al), silver (Ag), tantalum (Ta), tungsten (W), copper (Cu), titanium (Ti), indium (In), tin (Sn), iron (Fe), cobalt (Co), zinc (Zn), or a magnesium (Mg), an alloy containing therein any of these metallic elements, a conductive particle made of any of these materials, a conductive particle of an alloy containing therein any of these metals, and a conductive material such as polysilicon containing therein an impurity can be given as the materials composing the control electrode, the first electrode, the first electrode, the second electrode, the gate electrode, and the source/drain electrodes. Also, a lamination structure of layers containing therein these elements may also be adopted for the materials composing the control electrode, the first electrode, the first electrode, the second electrode, the gate electrode, and the source/drain electrodes. In addition, organic materials (conductive polymers) such as poly(3,4-ethylenedioxythiophene)/polystyrenesulfonic acid [PEDOT/PSS], and polyaniline can be given as the materials composing the control electrode, the first electrode, the first electrode, the second electrode, the gate electrode, and the source/drain electrodes. Also, the materials composing the control electrode, the first electrode, the second electrode, the gate electrode, and the source/drain electrodes either may be the same material or may be the different materials.

A combination of any of a physical vapor deposition method (PVD method), various kinds of chemical vapor deposition methods (CVD methods) including a MOCVD method, a liftoff method, a shadow mask method, and plating methods such as an electrolytic plating, a non-electrolytic plating, and a combination thereof, and a patterning technique as may be necessary can be given as a method of forming the materials composing the control electrode, the first electrode, the second electrode, the gate electrode, and the source/drain electrodes although depending on the materials composing the control electrode, the first electrode, the second electrode, the gate electrode, and the source/drain electrodes. It is noted that (a) various kinds of vacuum evaporation methods such as an electron beam heating method, a resistance heating method, flash evaporation, and a method of heating a crucible, (b) a plasma evaporation method, (c) various kinds of sputtering methods such as a bipole sputtering method, a D.C. sputtering method, a D.C. magnetron sputtering method, a high-frequency sputtering method, a magnetron sputtering method, an ion beam sputtering method, and a bias sputtering method, and (d) various kinds of ion plating methods such as a direct current (D.C.) method, an RF method, a multi-cathode method, an activated reactive method, an electric field evaporation method, a high-frequency ion plating method, and a reactive ion plating method.

When the electronic device or the semiconductor device of the present disclosure is applied to and used in the display device and the various kinds of electronic apparatuses, the electronic device or the semiconductor device either may be configured in the form of a monolithic circuit in which a large number of electronic devices and semiconductor devices are integrated on the substrate and the supporting body. Or, the electronic devices or the semiconductor devices may be cut to be individualized, and may be used in the form of discrete components or parts. In addition, the electronic device and the semiconductor device may be encapsulated with a resin.

Example 1

Example 1 relates to an electronic device of the present disclosure and a method of manufacturing the same, and a semiconductor device of the present disclosure and a method of manufacturing the same according to the first embodiment of the present disclosure. More particularly, Example 1 relates to a bottom gate•bottom contact type organic field effect transistor (hereinafter referred to as "an organic FET" in some cases), and a method of manufacturing the same.

Figure 1B:
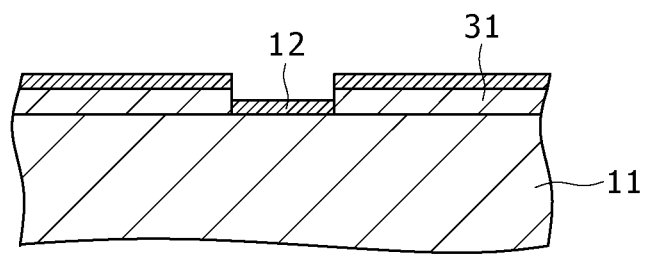
Figure 1C:
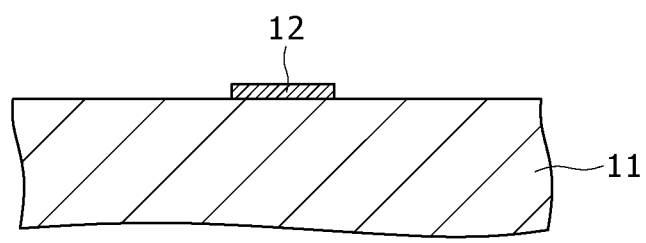
Figure 1D:
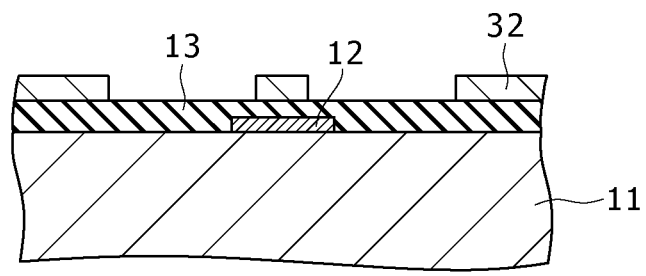
Figure 1E:
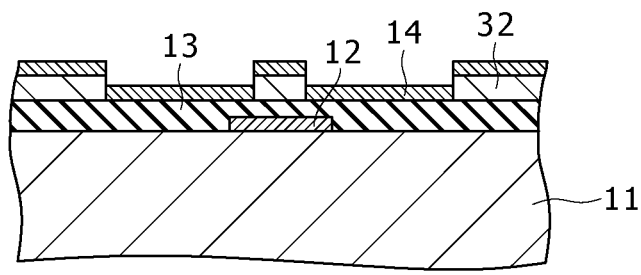
Figure 1F:
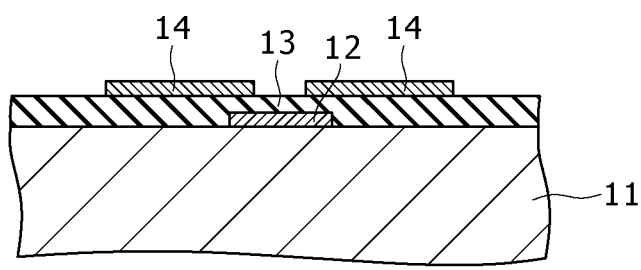
Figure 1G:
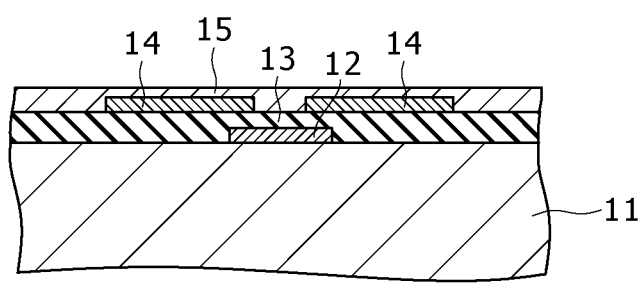
Figure 1H:
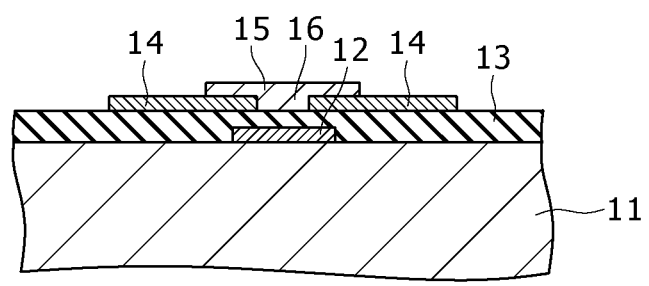
Figure 1I:
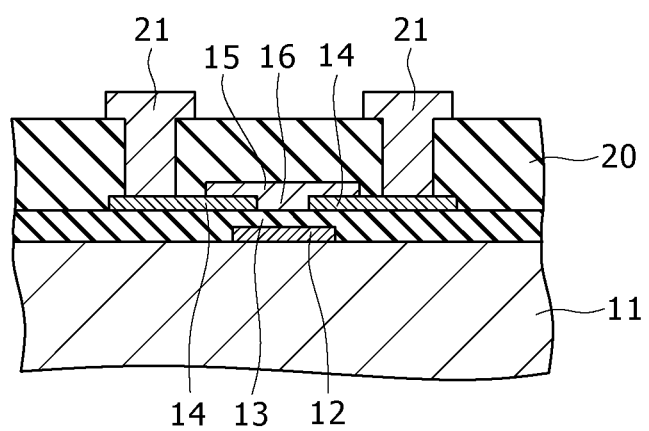

As shown in a schematic partial cross sectional view of FIG. 1I, the electronic device of Example 1 includes:
(A) a control electrode 12;
(B) a first electrode 14 and a second electrode 14; and
(C) an active layer 16 composed of an organic semiconductor material layer 15 and provided between the first electrode 14 and the second electrode 14 so as to face the control electrode 12 through an insulating layer 13. In addition, the semiconductor device of Example 1 includes a gate electrode 12, a gate insulating layer 13, source/drain electrodes 14, and a channel formation region 16 composed of an organic semiconductor material layer 15.

Or, the semiconductor device of Example 1 (specifically, the bottom gate•bottom contact type semiconductor device, and more specifically, the bottom gate•bottom contact type field effect transistor, FET, that is, the thin film transistor, TFT) includes:
(A) a gate electrode 12 formed on a substrate 11;
(B) a gate insulating layer 13 formed on the gate electrode 12 and the substrate 11;
(C) source/drain electrodes 14 formed on the gate insulating layer 13; and
(D) a channel formation region 16 formed on the gate insulating layer 13 between the source/drain electrodes 14.

In this case, a portion of the gate insulating layer 13 contacting at least the channel formation region 16 is composed of a layer obtained by curing the material expressed by the general structural formula (1) described above. Here, the channel formation region 16 is specifically composed of the organic semiconductor material layer 15. Also, the channel formation region 16 is formed on a portion of the gate insulating layer 13 located between the source/drain electrodes 14 so as to face the gate electrode 12. In addition, the organic semiconductor material layer 15 partially extends on the source/drain electrodes 14.

Also, the portion of the insulating layer 13 contacting at least the active layer 16, or the portion of the gate insulating layer 13 contacting at least the channel formation region 16 is composed of the layer (the layer made of the naphthalene framework type 4 functional epoxy resin) obtained by curing the material expressed by the following general structural formula (1) (either the starting material or the precursor material of either the insulating layer or the gate insulating layer). Specifically, the gate insulating layer 13 (or the insulating layer 13) has the single layer structure, and the entire gate insulating layer 13 (or the entire insulating layer 13) is composed of the layer obtained by curing the material expressed by the following general structural formula (1):

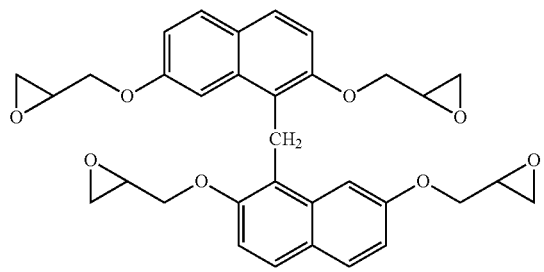

(1)

It is noted that the material expressed by the general structural formula (1), and 2-methylimidozole as the curing agent are mixed with each other (mixing weight ratio=100:5), thereby obtaining a liquid solution for formation of the gate insulating layer (solvent: cyclopentanone).

In Example 1, or Examples 2 to 4 which will be described later, the substrate 11 is composed of polyethersulfone (PES) substrate, each of the gate electrode 12, and the source/drain electrodes 14 is formed from a gold thin film, and the organic semiconductor material layer 15 is made of a peri-xanthenoxanthene (PXX) derivative, more specifically, made of a material expressed by the general structural formula (4):

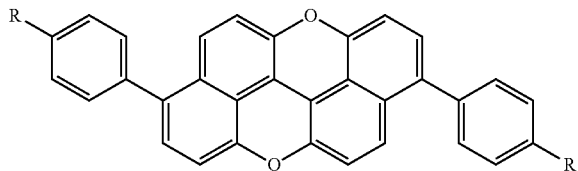

(4)

Hereinafter, the method of manufacturing the electronic device, or the method of manufacturing the semiconductor device in Example 1 will be described with reference to FIGS. 1A to 1I as schematically partial cross sectional views of the substrate and the like.

[Process-100]

Firstly, the gate electrode 12 is formed on the substrate 11. Specifically, a pattern for formation of the gate electrode is formed based on a resist layer 31 (refer to FIG. 1A). Next, a Ti layer as an adherence layer, and an Au layer becoming the gate electrode 12 are successively formed on the substrate 11 and the resist layer 31 by utilizing a vacuum evaporation method (refer to FIG. 1B). In FIG. 1B, an illustration of the adherence layer is omitted for the sake of simplicity. While the vacuum evaporation is carried out, the substrate 11 is placed on a substrate holder (not shown) for which a temperature can be adjusted, and thus a rise of a substrate temperature during the vacuum evaporation can be suppressed. Therefore, the deposition can be carried out under a condition such that a deformation of the substrate 11 is suppressed to a minimum. After that, the resist layer 31 is removed away by utilizing a liftoff method, thereby making it possible to obtain the gate electrode 12 composed of the Au layer (refer to FIG. 1C).

[Process-110]

Next, the gate insulating layer 13 is formed over the entire surface. That is to say, the gate insulating layer 13 is formed on both of the substrate 11 and the gate electrode 12.

In order to attain this process, the liquid solution for formation of the gate insulating layer described above is prepared. Specifically, a liquid solution obtained by dissolving the material expressed by the general structural formula (1) (the starting material or the precursor material of the insulating layer or the gate insulating layer) into cyclopentanone as the solvent is mixed with 2-methylimidazole as the curing agent, thereby preparing the liquid solution for formation of the gate insulating layer. Although a mixing amount of curing agent may be suitably adjusted to an amount corresponding to an equivalent weight of an epoxy group of the copolymer used, in Example 1, a mixing weight ratio is set to 100:5.

Also, after the resulting liquid solution for formation of the gate insulating layer is applied onto the substrate 11, the liquid solution for formation of the gate insulating layer is then heated and cured, thereby forming the gate insulating layer (insulating layer) 13 on the entire surface (specifically, on both of the substrate 11 and the gate electrode 12). More specifically, after an operation in which after the liquid solution for formation of the gate insulating layer is applied to the substrate 11 by utilizing a spin coating method, the resulting liquid solution for formation of the gate insulating layer is dried is carried out twice, the resulting liquid solution for formation of the gate insulating layer is heated at 150° C. for two hours in the atmosphere ambient. As a result, the curing reaction is produced. That is to say, the copolymer and the curing gent react each other, thereby making it possible to obtain the gate insulating layer (insulating layer) 13 composed of the layer obtained by curing the material expressed by the general structural formula (1) (the layer made of the naphthalene framework type 4 functional epoxy resin). It should be noted that after the operation in which after the liquid solution for formation of the gate insulating layer is applied to the substrate 11 by utilizing the application method, the resulting liquid solution for formation of the gate insulating layer is dried is carried out twice, whereby it is possible to reliably prevent a defect such as a pin hole from being generated in the finally obtained gate insulating layer (insulating layer) 13.

[Process-120]

After that the source/drain electrodes 14 are formed on the gate insulating layer 13. Specifically, a pattern for formation of the source/drain electrodes 14 is formed based on a resist layer 32 (refer to FIG. 1D). Next, a Ti layer as an adherence layer, and an Au layer becoming the gate electrode 12 are successively formed on both of the gate insulating layer 13 and the resist layer 32 by utilizing the vacuum evaporation method (refer to FIG. 1E). In FIG. 1E, an illustration of the adherence layer is omitted for the sake of simplicity. While the vacuum evaporation is carried out, the substrate 11 is placed on the substrate holder (not shown) for which the temperature can be adjusted, and thus a rise of a substrate temperature during the vacuum evaporation can be suppressed. Therefore, the deposition can be carried out under a condition such that a deformation of the substrate 11 is suppressed to a minimum. After that, the resist layer 32 is removed away by utilizing the liftoff method, thereby making it possible to obtain the source/drain electrodes 14 each composed of the Au layer (refer to FIG. 1F).

[Process-130]

Next, the channel formation region 16 composed of the organic semiconductor material layer 15 is formed on the gate insulating layer 13 located at least between the source/drain electrodes 14 (refer to FIG. 1G). Specifically, the organic semiconductor material layer 15 made of the PXX derivative expressed by the general structural formula (4) is formed on both of the source/drain electrodes 14 and the gate insulating layer 13 by utilizing the spin coating method, and is then dried. After that, as may be necessary, the organic semiconductor material layer 15 is patterned (refer to FIG. 1H).

[Process-140]

Next, an insulating layer 20 made of $SiO_2$ is formed over the entire surface by utilizing the well-known method. After that, an opening portion is formed in a portion of the insulating layer 20 above both of the gate electrode 12, and the source/drain electrodes 14. Then, a wiring material layer is formed on the insulating layer 20 including the opening portion thus formed, and is then patterned, whereby it is possible to form a wiring (not shown) connected to the gate electrode 12, and wirings 21 connected to the source/drain electrodes 14, respectively (refer to FIG. 1I). In such a way, it is possible to obtain the organic FET of Example 1.

Comparative Example 1

As Comparative Example 1, the gate insulating layer was composed of a layer obtained by curing a material composed of only a monomer of glycidyl methacrylate. It is noted that 2-methylimidazole was used as the curing agent, and the mixing weight ratio was set to copolymer:curing agent=100: 5. Except for this respect, a semiconductor device was manufactured similarly to the case of Example 1.

TABLE 1 shows the transistor characteristics of the semiconductor device of Example 1, and the transistor characteristics of the semiconductor device of Comparative Example 1.

TABLE 1

|  | Example 1 | Comparative Example 1 |
|---|---|---|
| mobility (cm$^2$/V · sec) | 0.6 | 0.01 |
| ON/OFF ratio | $1 \times 10^7$ | $1 \times 10^2$ |
| Hysteresis | absence | presence |

In Example 1, the portion of the insulating layer contacting at least the active layer, or the portion of the gate insulating layer contacting at least the channel formation region is formed by curing the material expressed by the general structural formula (1) described above. In this case, however, the temperature necessary for the curing is 150° C. which is lower than that in the related art. Therefore, it is possible to provide the electronic device or semiconductor device as the organic device on the resin substrate having the flexibility. Also, it is possible to provide the electronic device or semiconductor device having the high reliability at the low cost and with the high mass production. In addition, since the portion of the insulating layer contacting at least the active layer, or the portion of the gate insulating layer contacting at least the channel formation region is formed by curing the material expressed by the general structural formula (1) described above, an interface of the insulating layer or the gate insulating layer which the channel formation region contacts can be given a high smoothing property. In addition, the wettability for the gate insulating layer when the organic semiconductor material layer made of the PXX derivative expressed by the general structural formula (1) by utilizing the spin coating method is excellent. Moreover, it is thought that the interface of the insulating layer or the gate insulating layer contributes to the orientation state of the organic semiconductor material layer. As a result, it is possible to deposit the excellent organic semiconductor material layer, and thus the electronic device or semiconductor device as the organic device shows the high mobility. This also applies to Example 2 which will next be described.

Example 2

Example 2 relates to an electronic device of the present disclosure and a method of manufacturing the same, and a semiconductor device of the present disclosure and a method of manufacturing the same according to the second embodiment of the present disclosure. More specifically, Example 2 relates to a bottom gate•top contact type organic FET and a method of manufacturing the same.

Figure 2A:
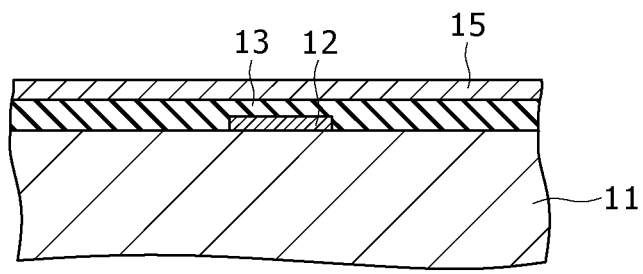
FIGS. 2A to 2C are respectively schematically partial cross sectional views of a substrate and the like explaining a method of manufacturing a semiconductor device of Example 2.
Figure 2B:
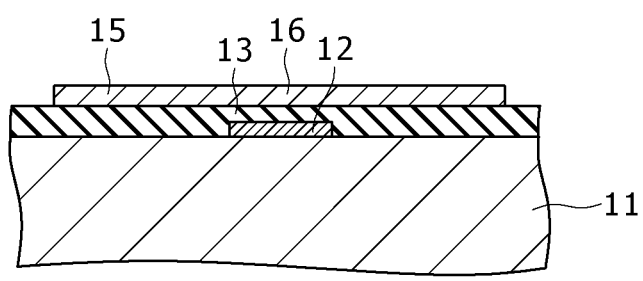
Figure 2C:
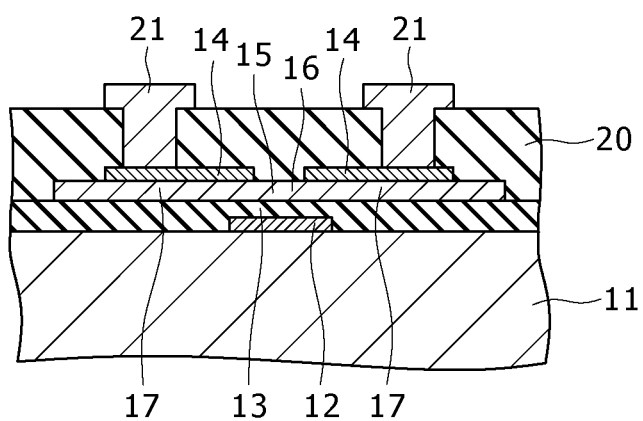

As shown in a schematically partial cross sectional view of FIG. 2C, the bottom gate•top contact type semiconductor device of Example 2 (specifically, the bottom gate•top contact type field effect transistor, FET, and more specifically, the bottom gate•top contact type thin film transistor, TFT) includes:

(A) a gate electrode 12 formed on a substrate 11;

(B) a gate insulating layer 13 formed on the gate electrode 12 and the substrate 11;

(C) a channel formation region 16 and a channel formation region extending portion 17 formed on the gate insulating layer 13; and (D) source/drain electrodes 14 formed on the channel formation region extending portion 17.

In this case, a portion of the gate insulating layer 13 contacting at least the channel formation region 16 is composed of the layer obtained by curing the material expressed by the general structural formula (1) described above. It is noted that each of the channel formation region 16 and the channel formation region extending portion 17 is composed of an organic semiconductor material layer 15, and the channel formation region 16 faces the gate electrode 12.

Although in such a way, the organic FET of Example 2 is opposite in a vertical disposition state of the source/drain electrodes 14, and the organic semiconductor material layer 15 to the organic FET of Example 1, other respects can be made identical to those in the organic FET of Example 1. For this reason, a detailed description of the organic FET of Example 2 is omitted here for the sake of simplicity.

Hereinafter, the method of manufacturing the semiconductor device of Example 2 will be described with reference to FIGS. 2A to 2C as schematically partial cross sectional views of the substrate and the like.

[Process-200]

Firstly, the gate electrode 12 is formed on the substrate 11 similarly to the case of [Process-100] of Example 1.

[Process-210]

Next, the gate insulating layer 13 is formed on the entire surface (specifically, on both of the substrate 11 and the gate electrode 12) similarly to the case of [Process-110] of Example 1.

[Process-220]

After that, the channel formation region 16 and the channel formation region extending portion 17 each composed of the organic semiconductor material layer 15 are formed on the insulating layer 13 similarly to the case of [Process-130] of Example 1 (refer to FIGS. 2A and 2B).

[Process-230]

After that, the source/drain electrodes 14 each composed of an Au layer are formed on the organic semiconductor material layer 15. Specifically, in a state in which a part of the organic semiconductor material layer 15, and the gate insulating layer 13 are both covered with a hard mask, a Ti layer as an adherence layer, and an Au layer becoming the source/drain electrodes are successively formed on the organic semiconductor material layer 15 by utilizing the vacuum evaporation method. In FIG. 2B, an illustration of the adherence layer is omitted for the sake of simplicity. In such a way, the source/drain electrodes 14 each composed of the Au layer can be formed without utilizing a photolithography process.

[Process-240]

Next, an insulating layer 20 made of $SiO_2$ is formed over the entire surface similarly to the case of [Process-140] of Example 1 by utilizing the well-known method. After that, an opening portion is formed in a portion of the insulating layer 20 above the gate electrode 12, and the source/drain electrodes 14. Then, a wiring material layer is formed on the insulating film 20 including the opening portion, and is then patterned, whereby it is possible to form a wiring (not shown) connected to the gate electrode 12, and wirings 21 connected to the source/drain electrodes 14, respectively (refer to FIG. 2C). In such a way, it is possible to obtain the organic FET of Example 2.

Example 3

Example 3 relates to an electronic device of the present disclosure and a method of manufacturing the same, and a semiconductor device of the present disclosure and a method of manufacturing the same according to the third embodiment of the present disclosure. More specifically, Example 3 relates to a top gate•bottom contact type organic FET and a method of manufacturing the same.

Figure 3A:
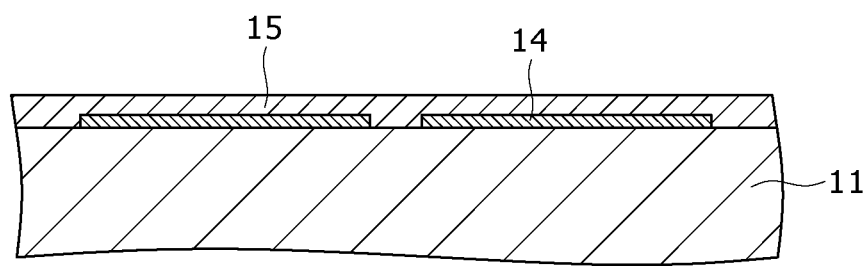
FIGS. 3A to 3C are respectively schematically partial cross sectional views of a substrate and the like explaining a method of manufacturing a semiconductor device of Example 3.
Figure 3B:
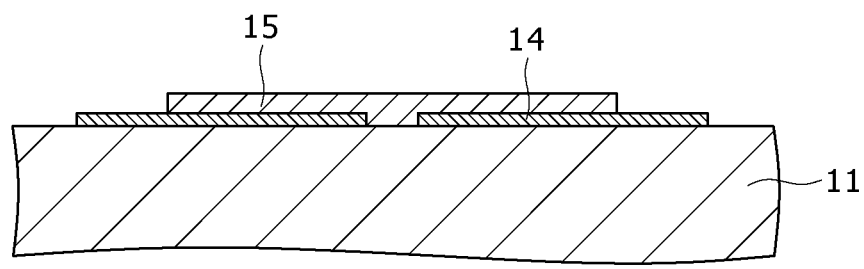
Figure 3C:
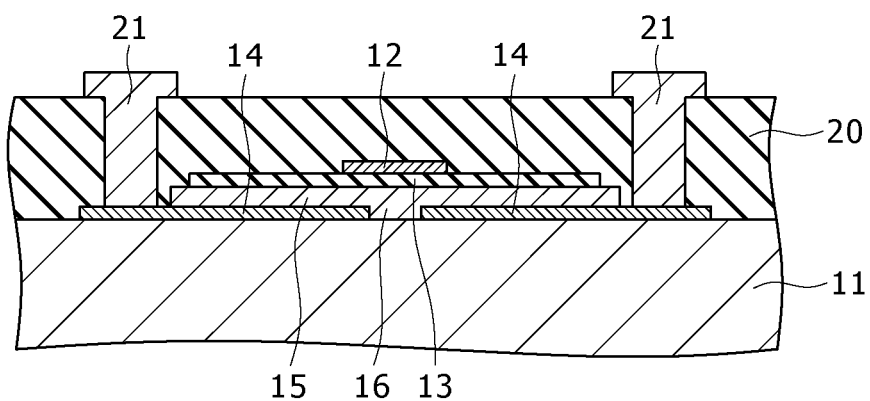

As shown in a schematically partial cross sectional view of FIG. 3C, the top gate•bottom contact type semiconductor device of Example 3 (specifically, the bottom gate•top contact type field effect transistor, FET, and more specifically, the top gate•bottom contact type thin film transistor, TFT) includes:

(A) source/drain electrodes 14 formed on a substrate 11;

(B) a channel formation region 16 composed of an organic semiconductor material layer 15 and formed on the substrate 11 between the source/drain electrodes 14; and (C) a gate insulating layer 13 formed on the channel formation region 16; and (D) a gate electrode 12 formed on the gate insulating layer 13.

In this case, a portion of the gate insulating layer 13 contacting at least the channel formation region 16 is composed of the layer obtained by curing the material expressed by the general structural formula (1) described above. It is noted that the channel formation region 16 faces the gate electrode 12.

Hereinafter, the method of manufacturing the organic FET of Example 3 will be described with reference to FIGS. 3A to 3C as schematically partial cross sectional views of the substrate and the like.

[Process-300]

Firstly, the source/drain electrodes 14 are formed on the substrate 11 similarly to the case of [Process-120] of Example 1.

[Process-310]

Next, the channel formation region 16 composed of the organic semiconductor material layer 15 is formed over the entire surface similarly to the case of [Process-130] of Example 1 (refer to FIGS. 3A and 3B).

[Process-320]

After that, the gate insulating layer 13 is formed on the entire surface similarly to the case of [Process-110] of Example 1.

[Process-330]

Next, the gate electrode 12 is formed on a portion of the gate insulating layer 13 above the channel formation region 16. Specifically; an adherence layer composed of a Ti layer, and the gate electrode 12 composed of the Au layer are formed on the gate insulating layer 13 similarly to the case of [Process-100] of Example 1. In FIG. 3B, an illustration of the adherence layer is omitted for the sake of simplicity. Or, in a state in which a part of the gate insulating layer 13 is covered with a hard mask, the Ti layer as the adherence layer, and the Au layer becoming the gate electrode may be successively formed on the gate insulating layer 13 by utilizing the vacuum evaporation method. As a result, the gate electrode 12 can be formed without utilizing the photolithography process.

[Process-340]

Next, an insulating layer 20 made of $SiO_2$ is formed over the entire surface similarly to the case of [Process-140] of Example 1 by utilizing the well-known method. After that, an opening portion is formed in a portion of the insulating layer 20 above both of the gate electrode 12, and the source/drain electrodes 14. Then, a wiring material layer is formed on the insulating film 20 including the opening portion, and is then patterned, whereby it is possible to form a wiring (not shown) connected to the gate electrode 12, and wirings 21 connected to the source/drain electrodes 14, respectively (refer to FIG. 2C). In such a way, it is possible to obtain the organic FET of Example 3.

Example 4

Example 4 relates to an electronic device of the present disclosure and a method of manufacturing the same, and a semiconductor device of the present disclosure and a method of manufacturing the same according to the fourth embodiment of the present disclosure. More specifically, Example 4 relates to a top gate•top contact type organic FET and a method of manufacturing the same.

Figure 4A:
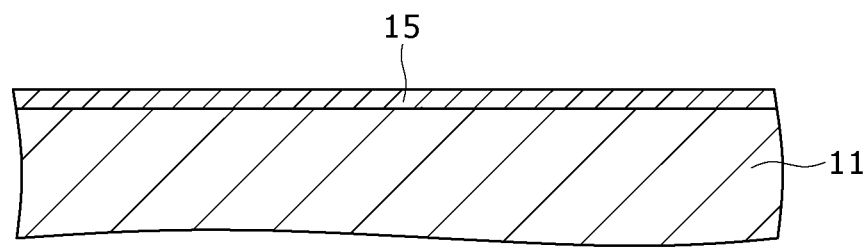
FIGS. 4A to 4C are respectively schematically partial cross sectional views of a substrate and the like explaining a method of manufacturing a semiconductor device of Example 4.
Figure 4B:
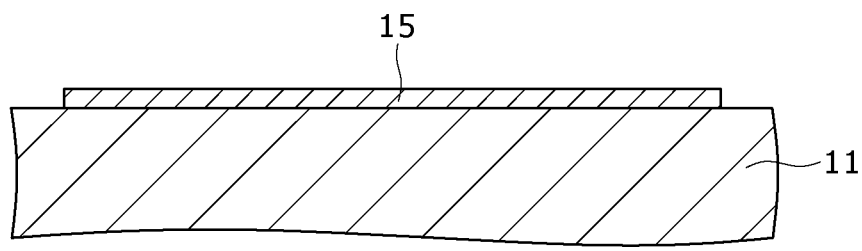
Figure 4C:
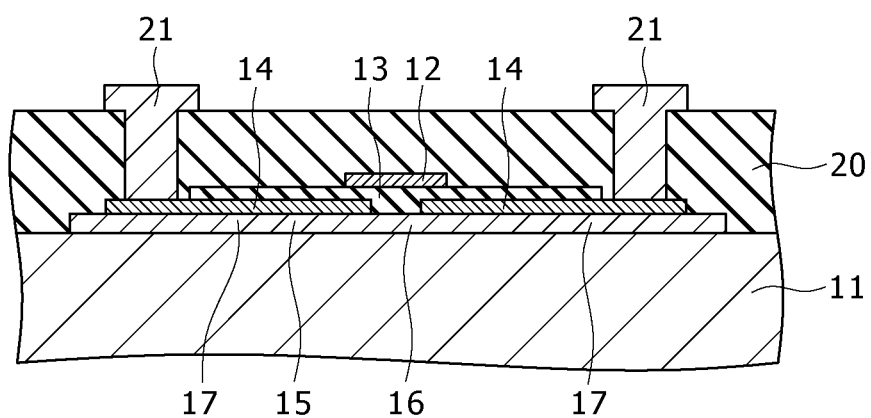

As shown in a schematically partial cross sectional view of FIG. 4C, the top gate•top contact type semiconductor device of Example 4 (specifically, the bottom gate•top contact type field effect transistor, FET, and more specifically, the top gate•top contact type thin film transistor, TFT) includes:

(A) a channel formation region 16 and a channel formation region extending portion 17 each composed of an organic semiconductor material layer 15 and formed on the substrate 11;

(B) source/drain electrodes 14 formed on the channel formation region extending portion 17;

(C) a gate insulating layer 13 formed on the source/drain electrodes 14 and the channel formation region 16; and (D) a gate electrode 12 formed on the gate insulating layer 13.

Although the organic FET of Example 4 is opposite in a vertical disposition state of the source/drain electrodes 14, and the organic semiconductor material layer 15 to the organic FET of Example 3, other respects can be made identical to those in the organic FET of Example 3. For this reason, a detailed description of the organic FET of Example 4 is omitted here for the sake of simplicity.

Hereinafter, the method of manufacturing the semiconductor device of Example 4 will be described with reference to FIGS. 4A to 4C as schematically partial cross sectional views of the substrate and the like.

[Process-400]

Firstly, the channel formation region 16 and the channel formation region extending portion 17 each composed of the organic semiconductor material layer 15 are formed on the substrate 11 similarly to the case of [Process-130] of Example 1 (refer to FIGS. 4A and 4B).

[Process-410]

After that, the source/drain electrodes 14 are formed on the channel formation region extending portion 17 similarly to the case of [Process-120] of Example 1.

[Process-420]

Next, the gate insulating layer 13 is formed over the entire surface similarly to the case of [Process-110] of Example 1.

[Process-430]

After that, the gate electrode 12 is formed on a portion of the gate insulating layer 13 above the channel formation region 16 similarly to the case of [Process-100] of Example 1.

[Process-440]

After that, an adherence layer composed of a Ti layer, and the gate electrode 12 composed of an Au layer are formed on the gate insulating layer 13. In FIG. 4B, an illustration of the adherence layer is omitted for the sake of simplicity. Or, in a state in which a part of the gate insulating layer 13 is covered with a hard mask, the Ti layer as the adherence layer, and the Au layer becoming the gate electrode may be successively formed on the gate insulating layer 13 by utilizing the vacuum evaporation method. As a result, the gate electrode 12 can be formed without utilizing the photolithography process.

[Process-450]

Next, an insulating layer 20 made of $SiO_2$ is formed over the entire surface similarly to the case of [Process-140] of Example 1 by utilizing the well-known method. After that, an opening portion is formed in a portion of the insulating layer 20 above both of the gate electrode 12, and the source/drain electrodes 14. Then, a wiring material layer is formed on the insulating film 20 including the opening portion, and is then patterned, whereby it is possible to form a wiring (not shown) connected to the gate electrode 12, and wirings 21 connected to the source/drain electrodes 14, respectively (refer to FIG. 4C). In such a way, it is possible to obtain the organic FET of Example 4.

Although the present disclosure has been described so far based on Examples 1 to 4, the present disclosure is by no means limited thereto. The structures, constitutions, forming conditions, and manufacturing conditions of the electronic device or the semiconductor device are merely exemplified, and thus can be suitably changed. Although in each of Examples 1 to 4, the portion of the insulating layer contacting at least the active layer was composed of the layer obtained by curing the material expressed by the general structural formula (1), instead, even when the portion of the insulating layer contacting at least the active layer was composed of the layer obtained by curing the material expressed by the following general structural formula (2) or (3), the temperature necessary for the curing was 150° C. which was lower than that in the related art, and thus the same effects as those of each of Examples 1 to 4 could be obtained. When the electronic device (semiconductor device) of the present disclosure, for example, is applied to and used in the display device and the various kinds of electronic apparatuses, they may be configured in the form of a monolithic circuit in which a large number of electronic devices (semiconductor devices) are integrated on the substrate, the supporting body, and the supporting member. Or, the electronic devices (semiconductor devices) may be cut to be individualized, and may be used in the form of discrete components or parts.

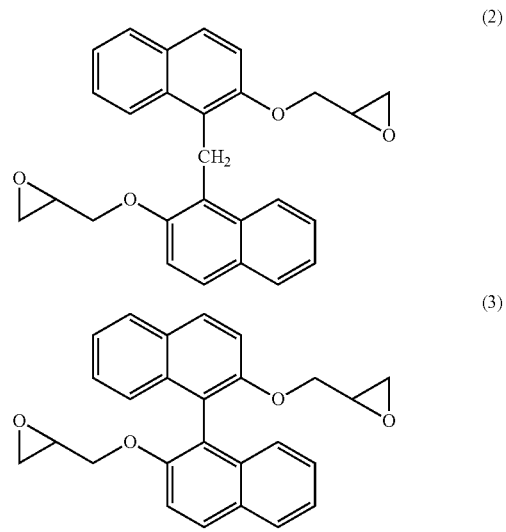

The present disclosure contains subject matter related to that disclosed in Japanese Priority Patent Application JP 2010-188103 filed in the Japan Patent Office on Aug. 25, 2010, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. An electronic device, comprising:

(A) a control electrode;

(B) a first electrode and a second electrode; and (C) an active layer composed of an organic semiconductor material layer provided between said first electrode and said second electrode so as to face said control electrode through an insulating layer, wherein a portion of said insulating layer contacting at least said active layer is composed of a layer obtained by curing a material expressed by the general structural formula (1), (2) or (3):

(1)

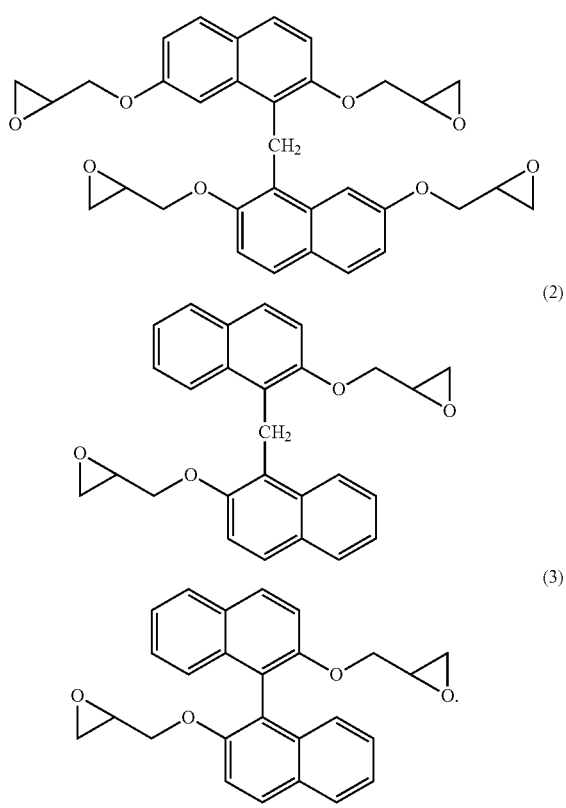

(2)

(3)

2. The electronic device according to claim 1, wherein said electronic device is a field effect transistor in which said control electrode corresponds to a gate electrode, said first electrode and said second electrode correspond to source/drain electrodes, respectively, said insulating layer corresponds to a gate insulating layer, and said active layer corresponds to a channel formation region.

3. A method of manufacturing an electronic device including:
  (A) a control electrode;
  (B) a first electrode and a second electrode; and
  (C) an active layer provided between said first electrode and said second electrode so as to face said control electrode through an insulating layer,
  wherein a portion of said insulating layer contacting at least said active layer is formed by curing a material expressed by the general structural formula (1), (2) or (3):

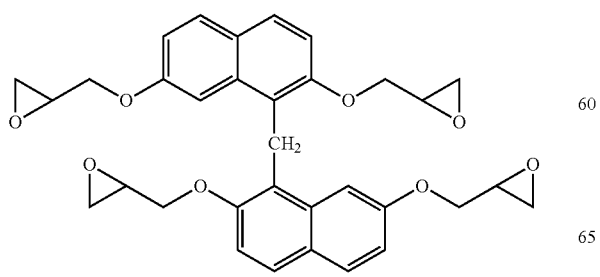

(1)

(2)

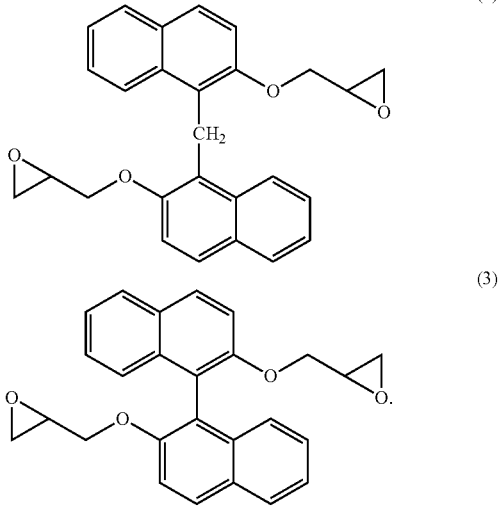

(3)

4. The method of manufacturing an electronic device according to claim 3, wherein said electronic device is a field effect transistor in which said control electrode corresponds to a gate electrode, said first electrode and said second electrode correspond to source/drain electrodes, respectively, said insulating layer corresponds to a gate insulating layer, and said active layer corresponds to a channel formation region.

5. A semiconductor device comprising:
  a gate electrode;
  a gate insulating layer;
  source/drain electrodes; and
  a channel formation region on a substrate,
  wherein a portion of said gate insulating layer contacting at least said channel formation region is composed of a layer obtained by curing a material expressed by the general structural formula (1), (2) or (3):

(1)

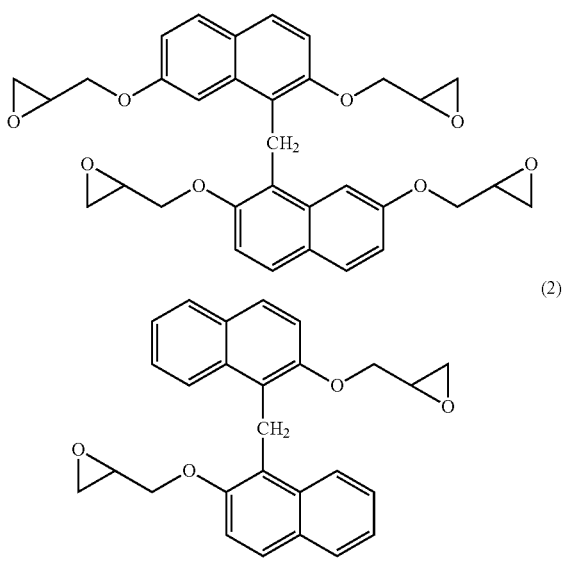

(2)

-continued (3)

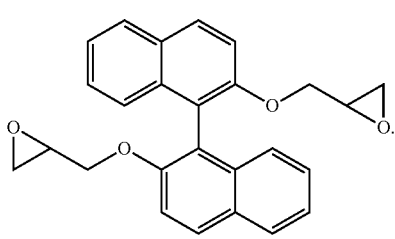

6. A method of manufacturing a semiconductor device, comprising:
   (a) forming a gate electrode on a substrate and forming a gate insulating layer over an entire surface;
   (b) forming source/drain electrodes on said gate insulating layer; and
   (c) forming a channel formation region composed of an organic semiconductor material layer on said gate insulating layer located at least between said source/drain electrodes,
   wherein a portion of said gate insulating layer contacting at least said channel formation region is formed by curing a material expressed by the general structural formula (1), (2) or (3):

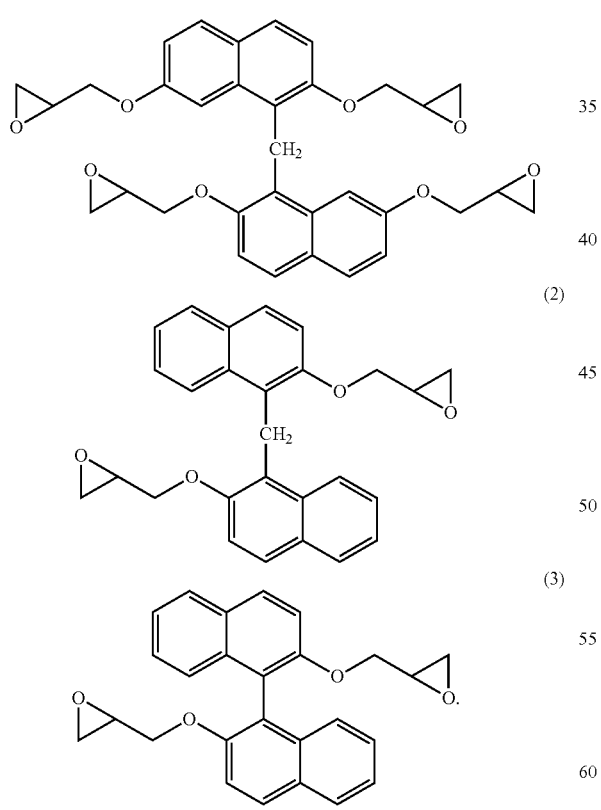

7. A method of manufacturing a semiconductor device, comprising:
   (a) forming a gate electrode on a substrate and forming a gate insulating layer over an entire surface;
   (b) forming a channel formation region and a channel formation region extending portion each composed of an organic semiconductor material layer on said gate insulating layer; and
   (c) forming source/drain electrodes on said channel formation region extending portion,
   wherein a portion of said gate insulating layer contacting at least said channel formation region is formed by curing a material expressed by the general structural formula (1), (2) or (3):

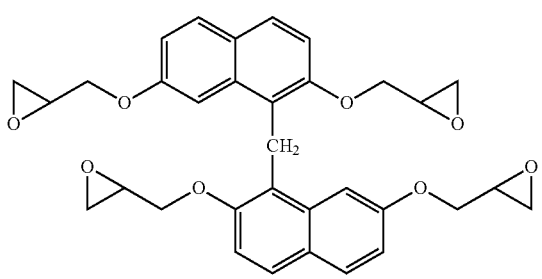

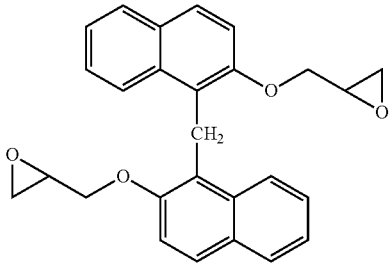

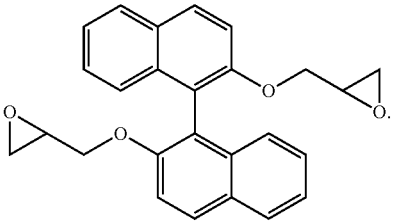

8. A method of manufacturing a semiconductor device, comprising:
   (a) forming source/drain electrodes on a substrate;
   (b) forming a channel formation region composed of an organic semiconductor layer over an entire surface; and
   (c) forming a gate insulating layer over an entire surface, and forming a gate electrode on a portion of said gate insulating layer on said channel formation region,
   wherein a portion of said gate insulating layer contacting at least said channel formation region is formed by curing a material expressed by the general structural formula (1), (2) or (3):

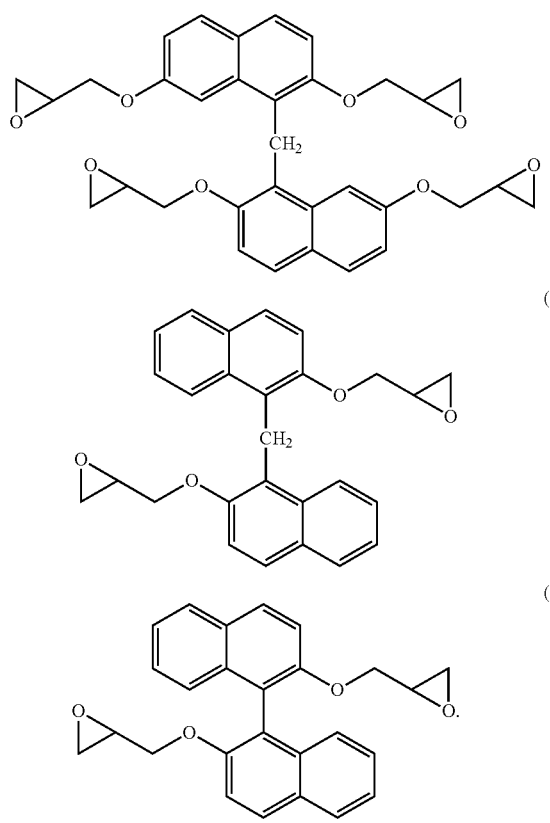

9. A method of manufacturing a semiconductor device, comprising:
   (a) forming a channel formation region and a channel formation region extending portion each composed of an organic semiconductor material layer on a substrate;
   (b) forming source/drain electrodes on said channel formation region extending portion; and
   (c) forming a gate insulating layer over an entire surface, and forming a gate electrode on a portion of said gate insulating layer on said channel formation region,
   wherein a portion of said gate insulating layer contacting at least said channel formation region is formed by curing a material expressed by the general structural formula (1), (2) or (3):

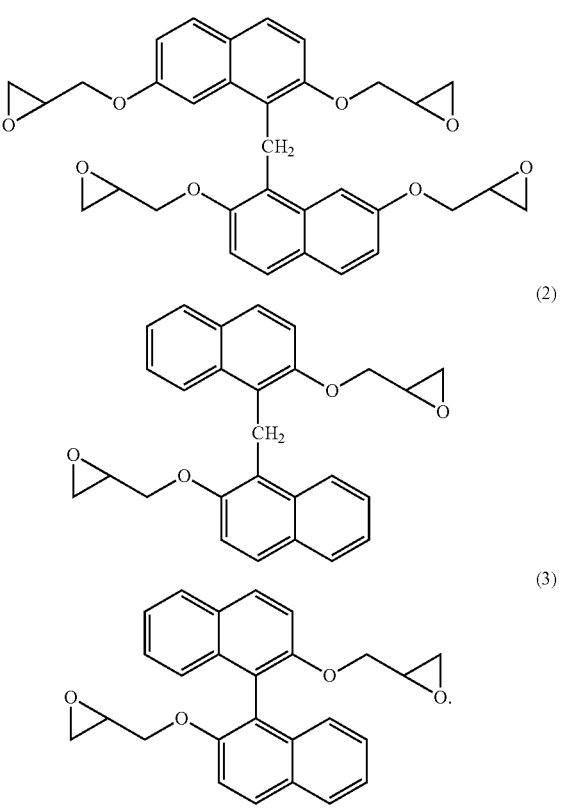

* * * * *